(12) United States Patent
Han et al.

(10) Patent No.: US 7,458,703 B2
(45) Date of Patent: Dec. 2, 2008

(54) LIGHT EMITTING DIODE PACKAGE HAVING DUAL LENS STRUCTURE FOR LATERAL LIGHT EMISSION

(75) Inventors: Kyung Taeg Han, Kyungki-do (KR); Myoung Soo Choi, Seoul (KR); Seon Goo Lee, Kyungki-do (KR); Seong Yeon Han, Kyungki-do (KR); Hun Joo Hahm, Kyungki-do (KR); Chang Ho Song, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 204 days.

(21) Appl. No.: 11/488,067

(22) Filed: Jul. 18, 2006

(65) Prior Publication Data

US 2007/0019416 A1  Jan. 25, 2007

(30) Foreign Application Priority Data

Jul. 19, 2005  (KR) ...................... 10-2005-0065505

(51) Int. Cl.
*F21V 7/00* (2006.01)
(52) U.S. Cl. ...................... 362/267; 362/328; 362/310; 257/98; 257/E33.056
(58) Field of Classification Search ................ 362/267, 362/268, 327, 328, 800, 307, 308, 347, 297, 362/346, 343; 257/95, 98, 100, 687, 730, 257/787, 788, 789, 790, 795, 796, E33.056
See application file for complete search history.

(56) References Cited

U.S. PATENT DOCUMENTS

| | | | |
|---|---|---|---|
| 6,679,621 B2 | 1/2004 | West et al. | |
| 6,850,001 B2 * | 2/2005 | Takekuma | 313/501 |
| 6,972,439 B1 * | 12/2005 | Kim et al. | 257/98 |
| 7,019,334 B2 * | 3/2006 | Yatsuda et al. | 257/98 |
| 7,049,740 B2 * | 5/2006 | Takekuma | 313/501 |
| 7,070,304 B2 * | 7/2006 | Imai | 362/267 |
| 7,111,964 B2 * | 9/2006 | Suehiro et al. | 362/328 |
| 7,118,262 B2 * | 10/2006 | Negley | 362/555 |
| 7,214,116 B2 * | 5/2007 | Takekuma | 445/24 |

* cited by examiner

*Primary Examiner*—Thomas M Sember
(74) *Attorney, Agent, or Firm*—McDermott Will & Emery LLP (57) ABSTRACT

An LED package having a dual structure for lateral emission of light includes an LED chip, a lower structure, a lower lens and an upper lens. The lower structure includes a pair of electric connection parts, a package body, and a transparent encapsulant filled in the recess of the package body to seal the LED chip. The upper-hemispheric lower lens is fixed to an upper part of the lower structure with a bottom part thereof attached to an upper surface of the transparent encapsulant. The funnel-shaped upper lens is fixed to an upper end of the lower lens, and includes an axially symmetrical reflecting surface for laterally reflecting light from the lower lens, and an emitting surface for laterally emitting light reflected from the reflecting surface. The upper lens and the lower lens are separately molded and combined together to easily manufacture and efficiently install the LED package.

12 Claims, 10 Drawing Sheets

LIGHT EMITTING DIODE PACKAGE HAVING DUAL LENS STRUCTURE FOR LATERAL LIGHT EMISSION

CLAIM OF PRIORITY

This application claims the benefit of Korean Patent Application No. 2005-65505 filed on Jul. 19, 2005, in the Korean Intellectual Property Office, the disclosure of which is incorporated herein by reference.

BACKGROUND OF THE INVENTION

1. Field of the Invention

The present invention relates to a light emitting diode package having a lens structure for lateral emission of light, and more particularly, to a light emitting diode package which is easily manufactured by separately molding an upper lens and a lower lens and binding them together, and is efficiently installed.

2. Description of the Related Art

With recent developments in electronic devices industry, Liquid Crystal Displays (LCDs) are drawing attention as the next-generation display apparatus. An LCD does not generate light on its own, and thus typically requires a backlight module for generating light at the back of an LCD panel.

Figure 1:
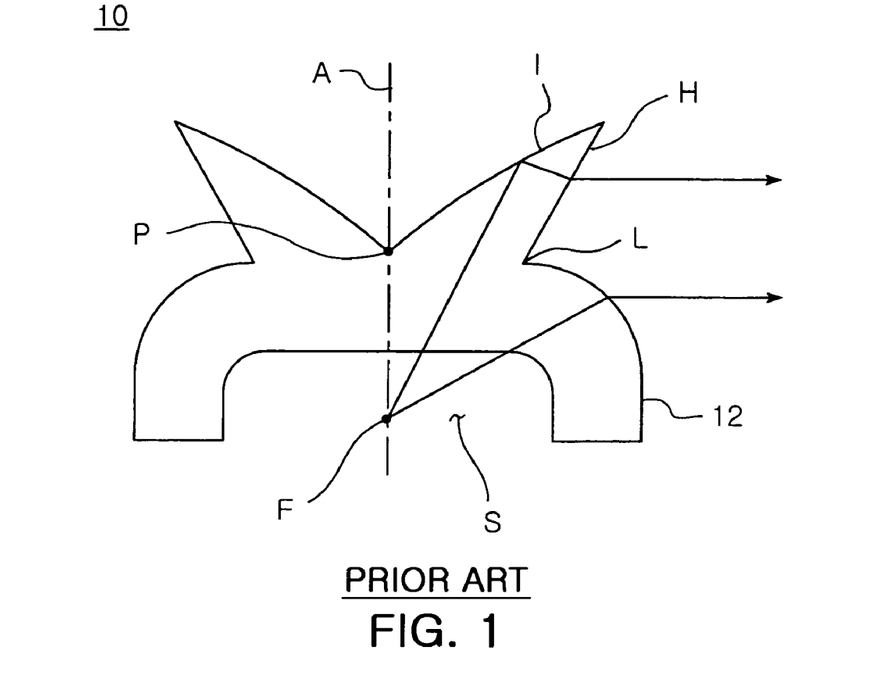
FIG. 1 is a sectional view illustrating a conventional LED lens.

FIG. 1 is a sectional view illustrating an example of a conventional side-emitting Light Emitting Diode (hereinafter, referred to as LED) used in an LCD backlight module, disclosed in U.S. Pat. No. 6,679,621.

Referring to FIG. 1, the LED lens 10 disclosed in the above document includes an upper part having a reflecting surface I and a refracting surface H, and a lower part having a refracting surface 12. In three dimensions, the LED lens 10 is shaped symmetrically about an axis A.

In this LED lens, light emitted from a focus F is reflected on the reflecting surface I and then exits through the refracting surface H to the outside, or light exits directly through the refracting surface 12. As a result, light is hardly emitted upward but emitted laterally about the axis A.

However, the above conventional LED 10 has following problems.

First, it is difficult to mold the LED lens 10. That is, it is difficult to precisely form a connection part L connecting the refracting surface H and the lower refracting surface 12, and an inner vertex P where the reflecting surfaces I converge. Also, there may be lines formed on or in the proximity of the connection part L of the lens 10.

Further, an additional process is required to prevent air bubbles while filling in a space S housing an LED chip denoted by the focus F with resin.

This process is explained with reference to FIGS. 1 and 2. First, the LED lens 10 is placed upside down and transparent resin 24 is poured to fill in the space S of the LED lens 10. In the meantime, the LED chip 22 is mounted on a substrate 20, and the coupled structure is attached to the upside-down LED lens 10 such that the LED chip 22 is positioned inside the space S of the LED lens 10. The final structure is overturned again into the original position, which is shown in FIG. 2.

However, in this case, the air bubbles produced in the resin 24 in the space S cannot escape, which may degrade optical characteristics of the LED package. In addition, the LED chip 22 is immersed in the resin 24 in the space S, which results in the overflowing resin that is difficult to handle.

Moreover, the LED lens 10 has a complex structure and thus needs to be molded with resin having excellent moldability such as polycarbonate (PC) or polyethylene (PE). However, these kinds of resin are deformed typically at about 150° C., which restricts the process of mounting the package of FIG. 2 on the backlight module. That is, the package should be mounted on the backlight module without any exposure of heat to the lens 10, which complicates the manufacturing conditions.

Figure 2:
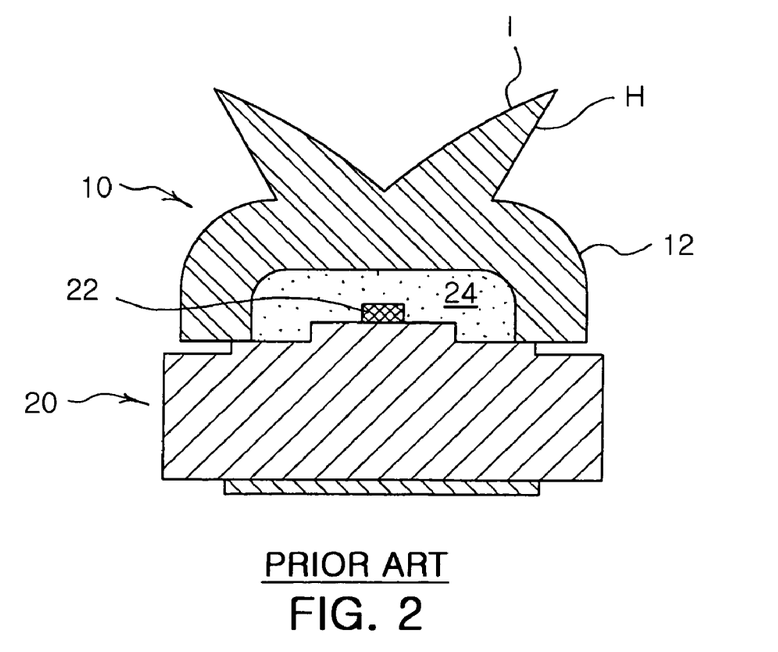
FIG. 2 is a sectional view illustrating a conventional LED package including the LED lens shown in FIG. 1.
Figure 3:
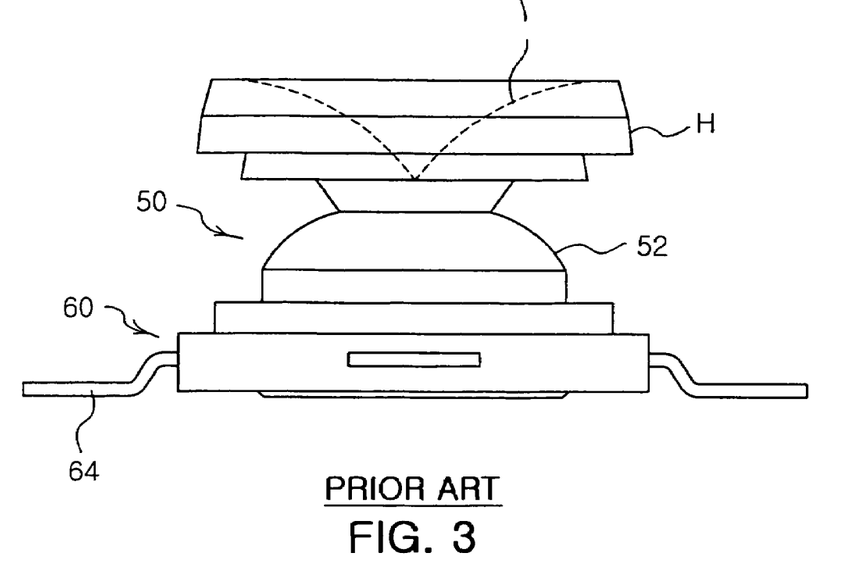
FIG. 3 is a side view illustrating another conventional LED package.

FIG. 3 illustrates another conventional example with a lens structure improved from that in FIGS. 1 and 2. An LED lens 50 of FIG. 3 has a different configuration of a refracting surface H from that in FIG. 1 in order to increase light emission efficiency. The rest of the configuration except the refracting surface H is substantially identical with that in FIGS. 1 and 2. Also, a pair of leads 64 is added to supply power to the LED chip.

However, as the package of FIG. 3 has the identical basic configuration with that in FIGS. 1 and 2, it is not free from the aforementioned problems regarding its structure and manufacturing processes. Further, the lens 50 has to be made of the same material as the LED lens 10 of FIGS. 1 and 2, which restricts the temperature conditions allowed in the manufacturing processes.

SUMMARY OF THE INVENTION

The present invention has been made to solve the foregoing problems of the prior art and therefore an object of certain embodiments of the present invention is to provide an LED package having a dual lens structure which is easily manufactured by separately molding and then binding an upper lens and a lower lens that are configured to laterally emit substantially all of the light from an LED chip, and is efficiently installed.

According to an aspect of the invention for realizing the object, there is provided a light emitting diode (LED) package having a dual lens structure including: an LED chip; a lower structure including a pair of electric connection parts for supplying power to the LED chip, a package body holding the electric connection parts and having a recess for upwardly guiding light from the LED chip, and a transparent encapsulant filled in the recess of the package body to seal the LED chip; a hemispheric lower lens fixed to an upper surface of the lower structure with a bottom part thereof attached to an upper surface of the transparent encapsulant; and a funnel-shaped upper lens fixed to an upper end of the lower lens, including an axially symmetrical reflecting surface for laterally reflecting light from the lower lens, and an emitting surface for laterally emitting light reflected from the reflecting surface.

Preferably, the lower lens has a planar undersurface for surface-to-surface contact with the upper surface of the lower structure.

The LED package according to the present invention may further include a transparent adhesive layer between the lower structure and the lower lens.

Preferably, the lower lens may have a groove formed on an upper end around an axis thereof, and the upper lens may have a projection which is formed on a lower end thereof and inserted into the groove of the lower lens, thereby being combined with the lower lens. At this time, the LED package may further include an adhesive layer between the groove of the lower lens and the projection of the upper lens. In addition, the upper lens may further include a plurality of second projections formed around the projection, and the lower lens may further include a plurality of second grooves formed around the groove for receiving the second projections.

Preferably, the lower lens has a plurality of projections on a periphery of an undersurface thereof, and the lower structure has a plurality of grooves formed around the recess for receiving the projections.

Preferably, each of the lower lens and the upper lens is made of one selected from a group consisting of epoxy molding compound, silicone, and epoxy resin.

The LED package according to the present invention may further include a heat conducting part for supporting the LED chip within the package body. The heat conducting part has a recess formed on a position directly below the recess of the package body for upwardly reflecting light generated from the LED chip. At this time, the heat conducting part may be integral with one of the electric connection parts. In addition, the heat conducting part may be composed of a plurality of metal plates, and the recess of the heat conducting part may be a hole formed in an uppermost one of the metal plates. Moreover, a portion of the heat conducting part and a portion of the package body around the LED chip may be cut out to form a slit-shaped path extending to the electric connection part, and the LED chip may be connected to the electric connection part by a wire through the slit-shaped path.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 4:
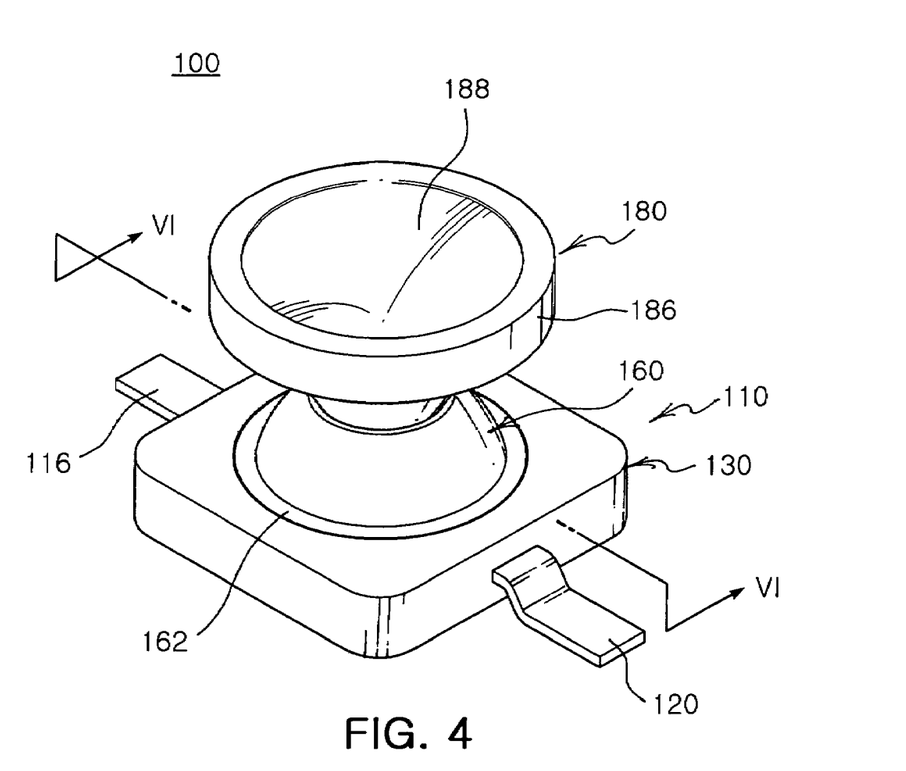
FIG. 4 is a perspective view illustrating an LED package according to the present invention.
Figure 5:
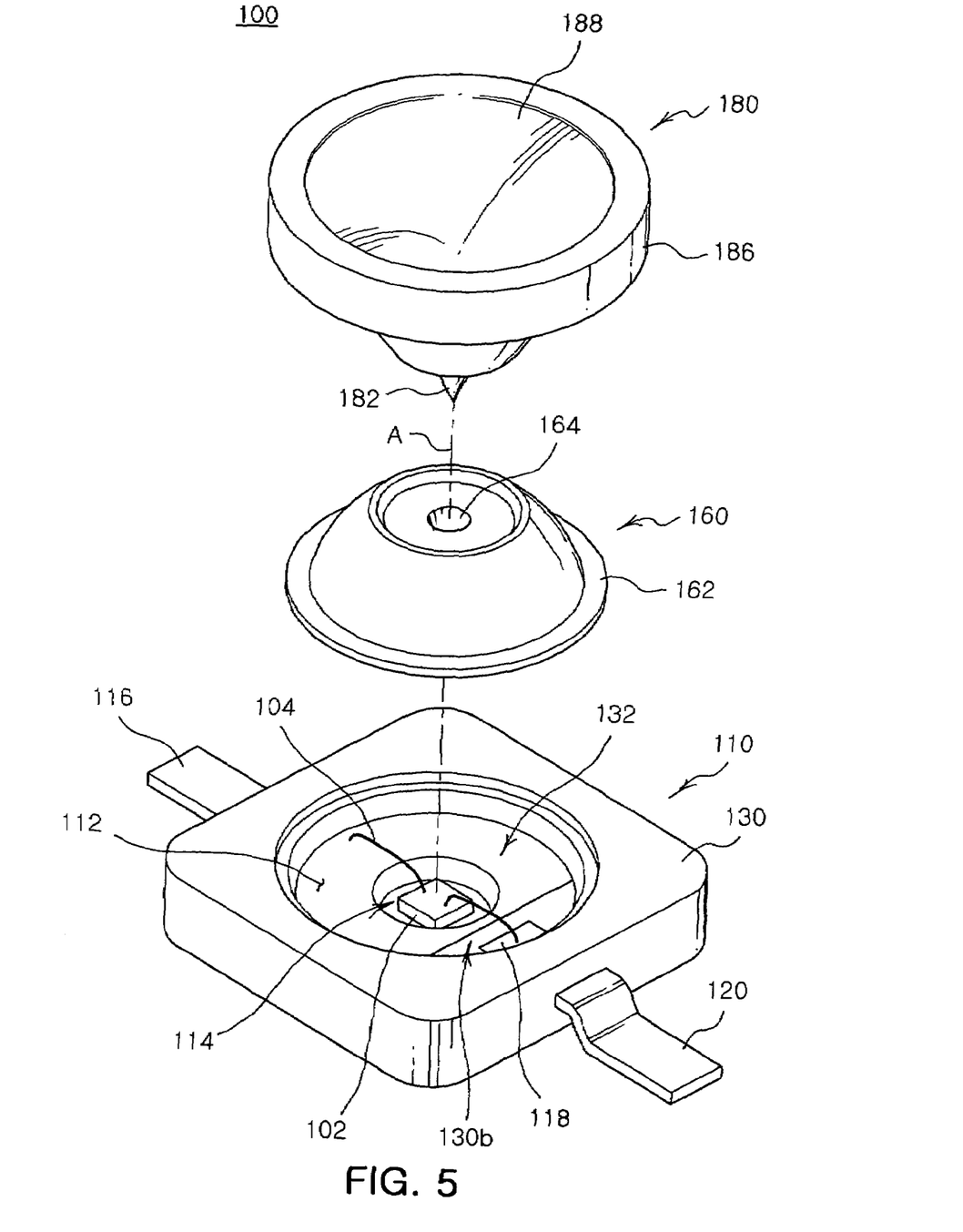
FIG. 5 is an exploded view illustrating the LED package shown in FIG. 4.
Figure 6:
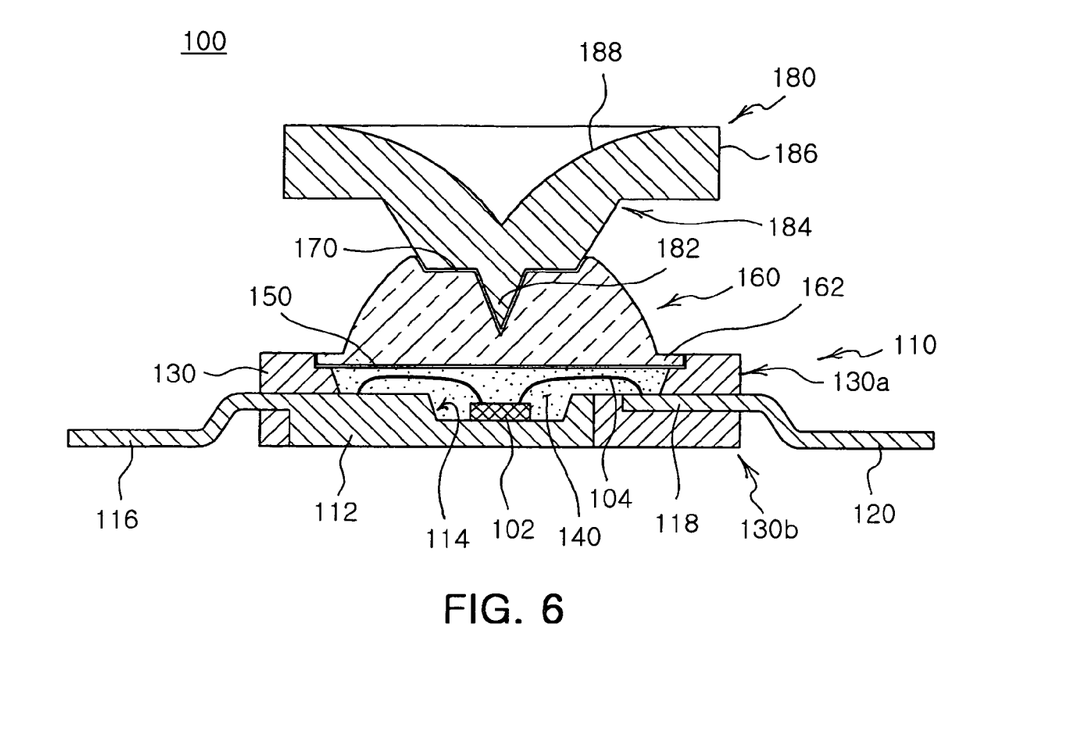
FIG. 6 is a sectional view taken along line 6-6 of FIG. 4.
Figure 7:
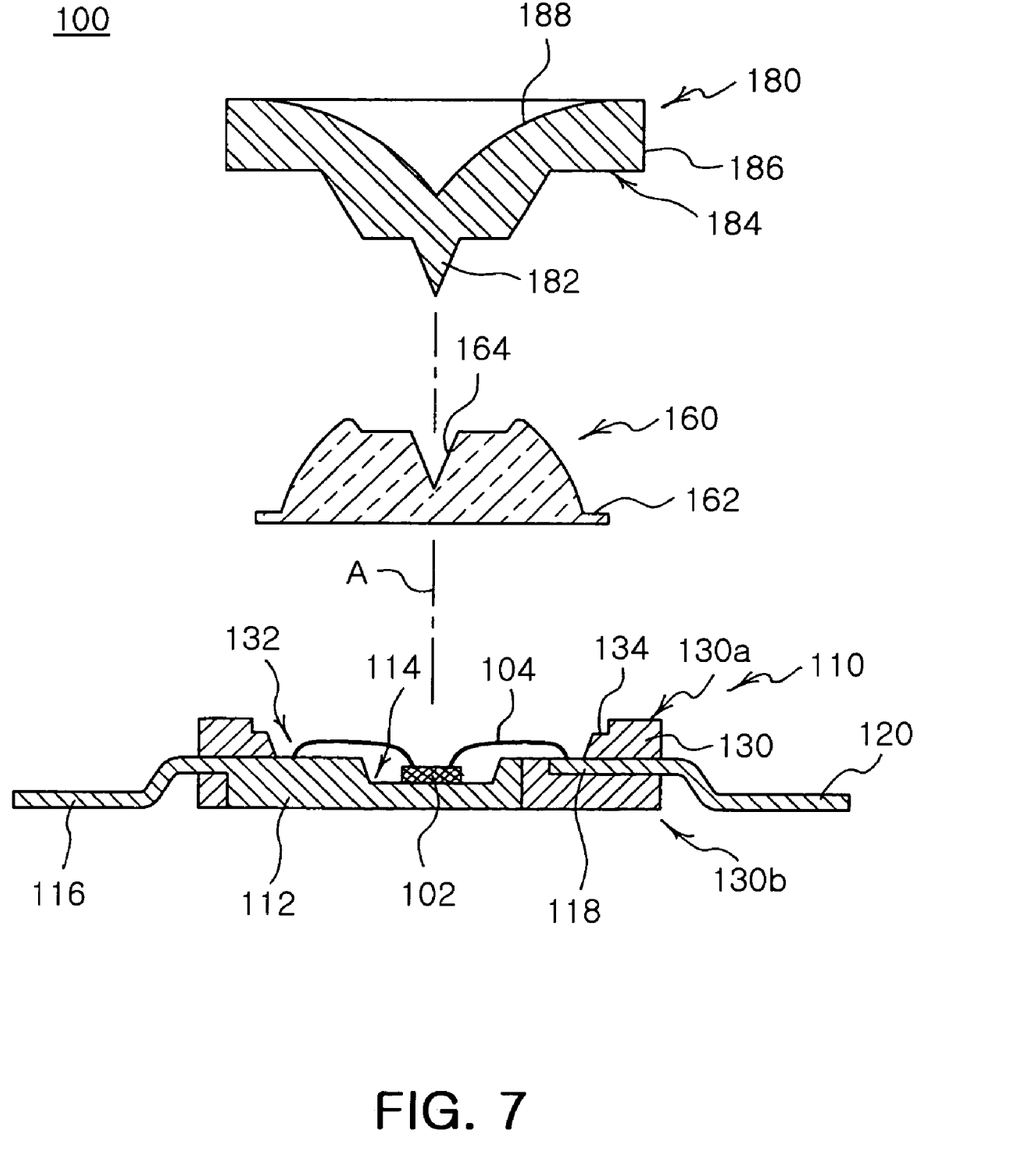
FIG. 7 is an exploded view illustrating the LED package shown in FIG. 6.

FIG. 4 is a perspective view illustrating an LED package having a dual lens structure according to the present invention, FIG. 5 is an exploded view of the LED package shown in FIG. 4, FIG. 6 is a sectional view taken along line 6-6 of FIG. 4, and FIG. 7 is an exploded view of the LED package shown in FIG. 6.

Referring to FIGS. 4 to 7, the LED package 100 having a dual lens structure according to the present invention includes a lower structure 110, a lower lens 160 and an upper lens 180.

The lower structure 110 includes a heat conducting part 112, a lead 120, a package body 130 holding parts of the heat conducting part 112 and the lead 120, and a transparent encapsulant 140.

The package body 130 is generally made of resin that is opaque or has high reflectivity. The package body 130 has a recess 132 surrounded by a stepped lower lens seating part 134, in a central portion of an upper part 130a thereof.

The heat conducting part 112 is made of metal or preferably a metal plate and has a recess 114 formed on an upper surface thereof for housing an LED chip 102 therein. The heat conducting part 112 is electrically connected to the LED chip 102 by a wire 104 to function as an internal electric connection part. A part of the heat conducting part 112 is extended out of the package body 130 to form a lead 116. In addition, the recess 114 functions as a reflecting mirror for upwardly reflecting light from the LED chip 102.

The lead 120 has an electric connection part 118 electrically connected to the LED chip 102 by a wire 104, and is insulated from the heat conducting part 112 by a part of the package body 130.

The transparent encapsulant 140 is filled in the recess 114 of the heat conducting part 112 and in the recess 132 of the package body 130.

The transparent encapsulant 140 is made of highly transparent resin that can transmit light generated from the LED chip 102 with minimum loss. Preferably, it can be made of elastic resin. Elastic resin refers to gel-type resin such as silicone, which exhibits minimal change by single-wavelength light, such as yellowing, while having high refractivity, thus demonstrating excellent optical characteristics. Further, unlike epoxy, it maintains gel or elastomer state even after being cured, and thus can stably protect the chip 102 from thermal stress, vibrations and external impacts.

In addition, the transparent encapsulant 140 is filled in the recesses 114 and 132 in a liquid state and cured, thus advantageously eliminating air bubbles therein during the curing process. That is, in the conventional LED package in FIG. 2, the resin 24 is cured with the lower part of the lens 10 and the substrate 20 combined together so that the air bubbles produced in the resin 24 may not escape. However, the transparent encapsulant 140 in the present invention is exposed to ambient air while being cured in the manufacturing process, allowing air bubbles to easily escape to the outside.

Here, an ultraviolet ray absorbent for absorbing ultraviolet rays generated from the LED chip 102 or phosphors for converting monochromatic light into white light can be mixed into the resin that constitutes the transparent encapsulant 140.

The lower lens 160 is bonded to the upper surface of the transparent encapsulant 140 by a transparent adhesive layer 150. The lower lens 160 is transparent and shaped like an upper hemisphere which is symmetrical about an axis A. The lower lens 160 has a flange 162 formed along a lower periphery, and has a recess 164 that is extended downward in the axial direction of the axis A in an upper end thereof.

The upper lens 180 is transparent and shaped like a funnel which is symmetrical about the axis A. The upper lens 180 has a projection 182 formed on a lower end thereof. The projection 182 is fixedly inserted into the groove 164 of the lower lens 160 by a transparent adhesive layer 170 therebetween.

The projection 182 extends upward to a side surface 184 and a light emitting surface 186. A reflecting surface 188 is formed on inner surfaces of the upper lens 180 to internally reflect light, or to preferably satisfy total internal reflection conditions.

The lower lens 160 and the upper lens 180 are combined together to have a substantially hourglass-shaped section. Therefore, a portion of light generated from the LED chip 102 is reflected at sides of the lower lens 160 to the outside. Another portion of light passes through the lower lens 160, internally reflected by the reflecting surface 188 of the upper lens 180, and emitted to the outside through the emitting surface 186. Therefore, light generated from the LED chip 102 is hardly emitted upward but mainly emitted laterally.

In the meantime, since the lower lens 160 and the upper lens 180 are separately molded and bonded together by the adhesive layer 170, they can be manufactured in a simple form compared with the conventional lenses in FIGS. 1 to 3. Thus, they can be manufactured using at least one selected from a group consisting of epoxy molding compound (EMC), silicone and epoxy resin besides polycarbonate and polyethylene. Once cured, these materials are not deformed even at a temperature of 150° C. or higher, and thus the lower and upper lenses 160 and 180 have greater process flexibility in terms of temperature and heat conditions compared with the conventional lenses. As a result, the LED package 100 can be manufactured at a relatively high temperature of at least 150° C. In particular, when mounting the LED package 100 to the backlight module, the leads 116 and 120 can be connected to wires of the substrate through various processes involving high temperature such as welding and soldering.

Meanwhile, the adhesive layers 150 and 170 can be substituted by other means or omitted. For example, before the transparent encapsulant 140 is completely cured, a transparent adhesive or epoxy can be applied on an undersurface of the lower lens 160, and the lower lens 160 can be placed on the upper surface of the transparent encapsulant 140, thereby solidly adhering the lower lens 160 to the transparent encapsulant 140 without forming any interfacial adhesive layers.

In addition, the projection 182 of the upper lens 180 can be formed to tightly fit into a groove 164 of the lower lens 160 or formed a bit larger than the groove 164 so that the projection 182 can be press-fitted into the groove 164, thereby binding the lower lens 160 with the upper lens 180. Needless to say, a small amount of adhesive can be poured into the groove 164 where the projection 182 can be inserted, thereby enhancing the effect of pressed-fitting.

Another binding structure of the lower and upper lenses will now be explained with reference to FIG. 8.

Figure 8:
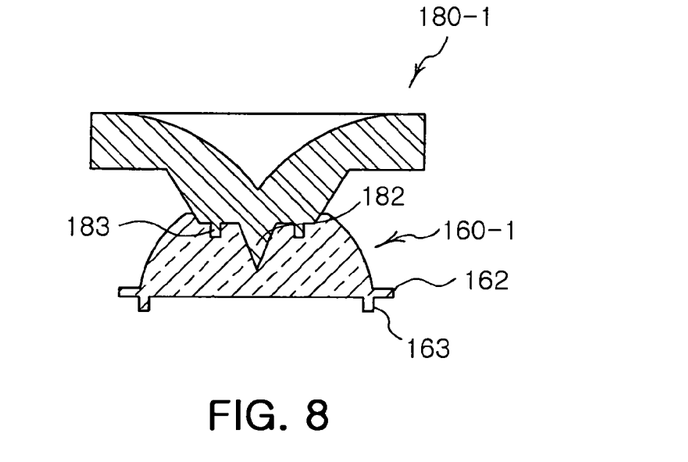
FIG. 8 is a sectional view illustrating an LED package according to another embodiment of the present invention.

Referring to FIG. 8, the lower lens 160-1 has projections 163 on an undersurface thereof. These projections 163 are inserted into grooves (not shown) formed on the seating part 134 (see FIGS. 6 and 7) of the package body, thereby binding the lower lens 160-1 with the package body. Needless to say, an adhesive can be poured into the grooves of the seating part and the projections 163 can be inserted thereinto, thereby enhancing the effect of binding by insertion.

In addition, projections 183 are formed also on a lower surface of the upper lens 183, and corresponding grooves are formed on an upper end of the lower lens 160 so that the projections 183 are inserted into the grooves to bind the upper lens 180 with the lower lens 160. Needless to say, an adhesive can be poured into the grooves of the lower lens 160 and the projection 183 can be inserted thereinto, thereby enhancing the effect of binding by insertion.

In the meantime, the heat conducting part 112 may not function as an electric connection part. For example, rather than connecting the lead 116 with the heat conducting part 112, another lead 120 having an electric connection part 118 can be formed to supply power to the LED chip 102.

Figure 10:
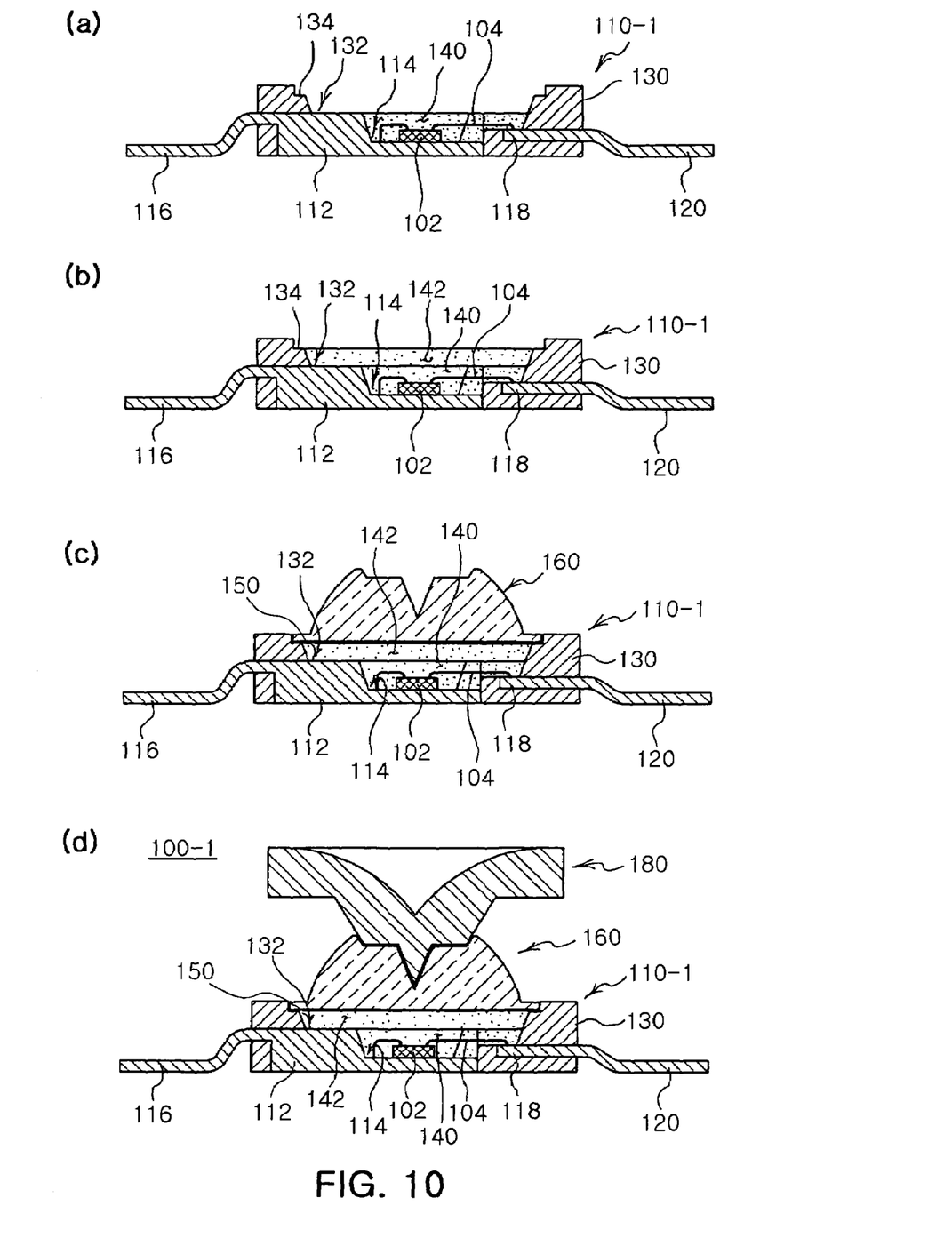
FIG. 10 is a sectional view illustrating a stepwise manufacturing method of the LED package according to another embodiment of the present invention.
Figure 11:
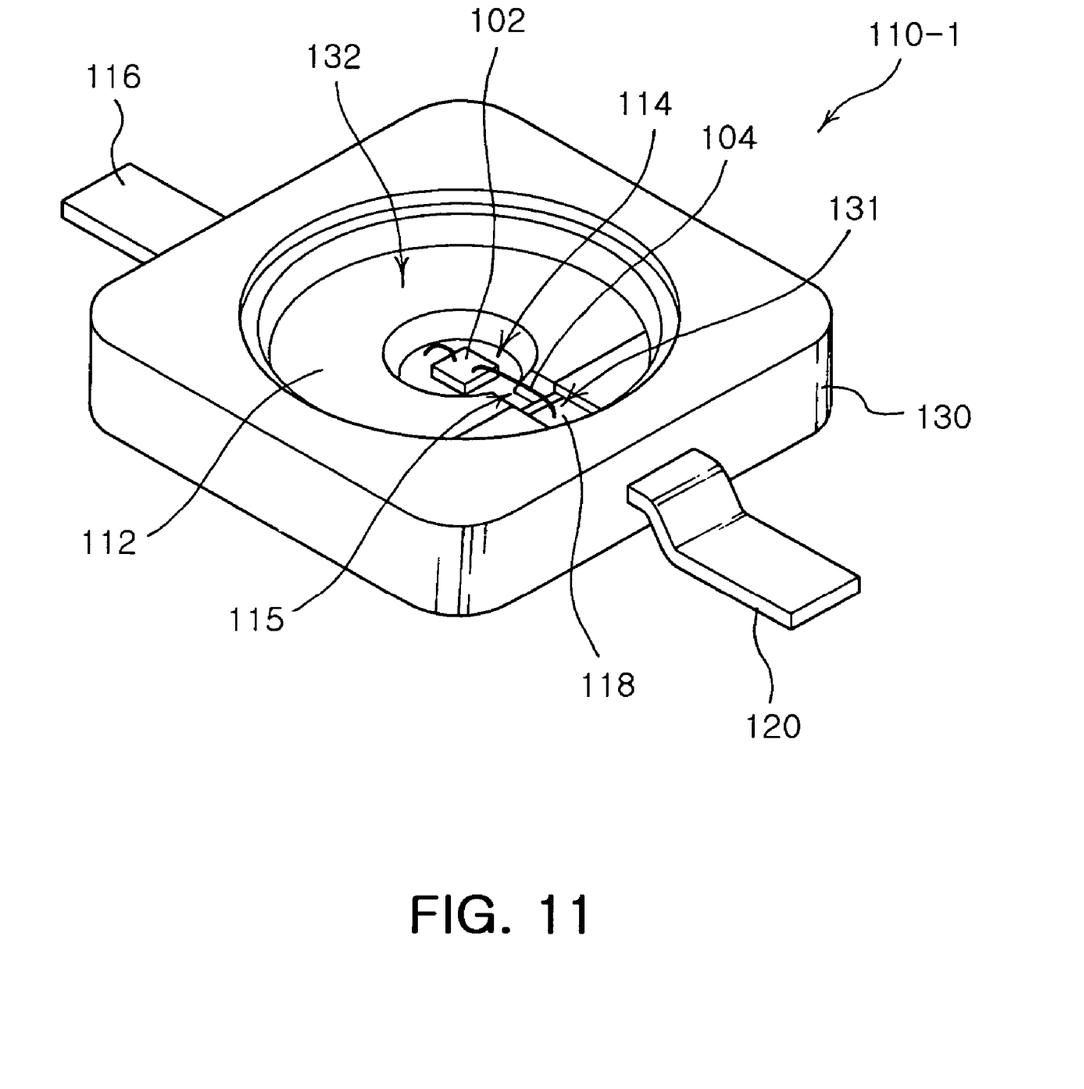
FIG. 11 is a perspective view illustrating the LED package in FIG. 10(a) with transparent resin removed.

In addition, instead of forming a recess 114 on the heat conducting part 112, the height of an upper part 130a of the package body 130 can be increased, thereby ensuring a sufficient thickness of the transparent encapsulant 140 covering the LED chip 102 and the wires 104. Alternatively, the wires 104 can be formed low as shown in FIGS. 10 and 11, explained later, so that the wires 104 can be sealed without the recess 114 nor having to increase the height of the upper part 130a of the package body 130.

Now, a manufacturing method of the LED package 100 having a dual lens structure according to the present invention will be explained with reference to FIG. 9.

Figure 9:
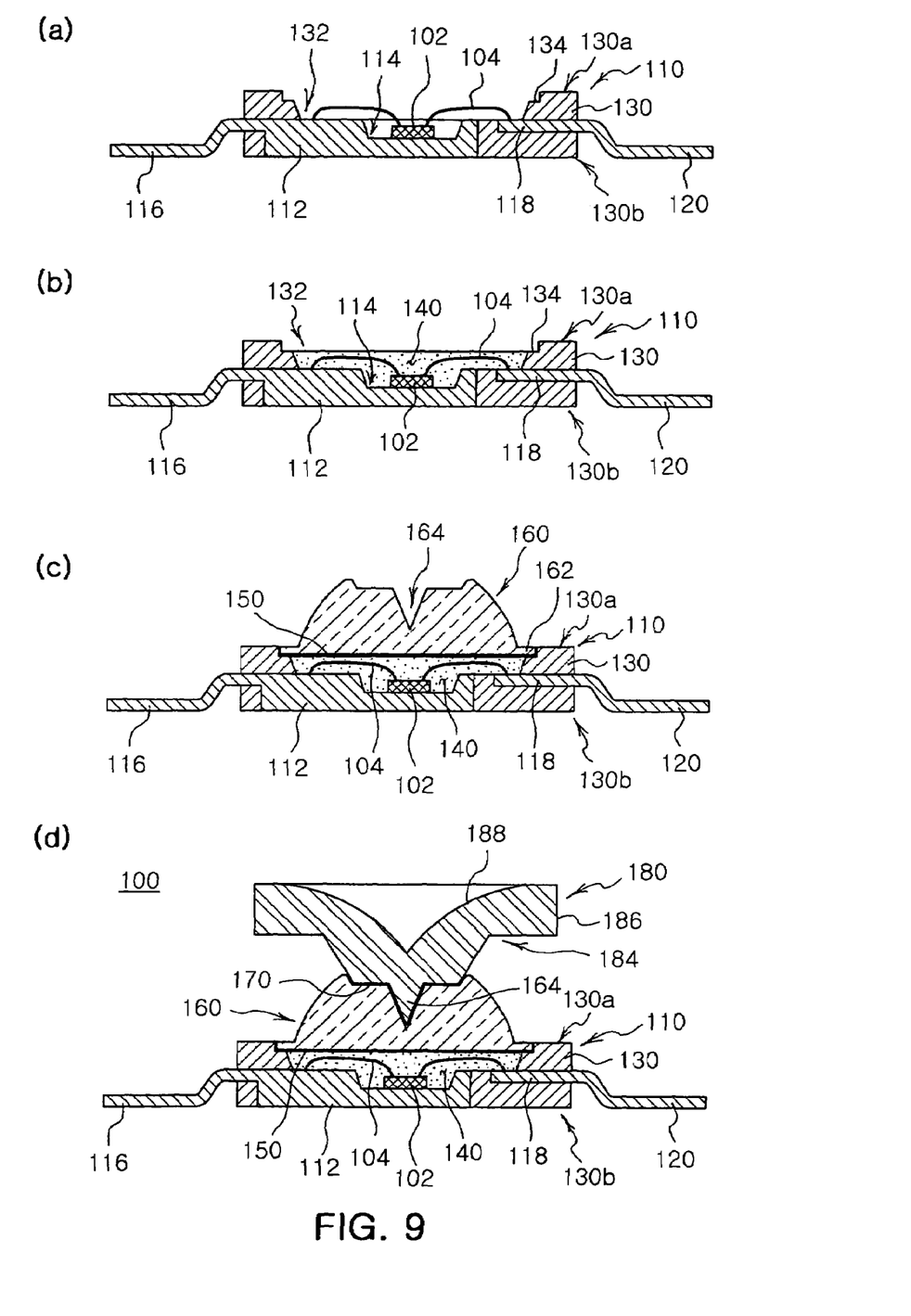
FIG. 9 is a sectional view illustrating a stepwise manufacturing method of the LED package according to the present invention.

First, as shown in FIG. 9(a), a heat conducting part 112 formed integrally with a lead 116, having a recess 114 on a central portion of an upper surface thereof, and a lead 120 having an electric connection part 118 are prepared. Then, a package body 130 is formed to hold the heat conducting part 112 and the electric connection part 118, and has a recess 132 formed in a position above the heat conducting part 112 and the electric connection part 118. Next, an LED chip 102 is mounted on the recess 114 of the heat conducting part 112, and connected to the heat conducting part 112 and the electric connection part 118 by wires 104.

Thereafter, as shown in FIG. 9(b), transparent resin is filled in the recesses 114 and 132 and cured to form a transparent encapsulant 140, thereby obtaining a lower structure 110. This lower structure 110 is identical with the one explained hereinabove with reference to FIGS. 4 to 7.

Next, as shown in FIG. 9(c), an adhesive layer 150 is applied on an upper surface of the transparent encapsulant 140 to attach a lower lens 160 on the transparent encapsulant 140. Then, as shown in FIG. 9(d), an adhesive layer 170 is applied to bond an upper lens 180 on the lower lens 160, thereby completing an LED package 100 according to the present invention. The LED package 100 has the same configuration explained hereinabove with reference to FIGS. 4 to 7.

As described above, the lower structure 110, the lower lens 160 and the upper lens 180 are individually formed, and combined together in their order to complete the LED package. This allows simplifying the shapes of the lower and upper lenses 160 and 180, and easier manufacturing process of the LED package 100.

In the meantime, before conducting the step of FIG. 9(c), electric/optical tests can be conducted on the structure of FIG. 9(b). Thereby, defects can be detected in the middle process to avoid any unnecessary follow-up procedures.

Now, an LED package having a dual lens structure and a manufacturing method of the same according to another embodiment of the present invention will be explained with reference to FIGS. 10 and 11.

The LED package 100-1 according to this embodiment has the identical configuration with the aforedescribed LED package 100 except a lower structure 110-1. Therefore, the same reference numerals are used for the corresponding components.

First, referring to FIGS. 10(a) and 11, a heat conducting part 112 formed integrally with a lead 116, having a recess 114 on a center of an upper surface, and a lead 120 having an electric connection part 118 are prepared. At this time, the heat conducting part 112 has a slit-shaped path 115 extending to the electric connection part 118. A package body 130 is formed to hold the heat conducting part 112 and the electric connection part 118. The package body 130 has a recess 132 formed above the heat conducting part 112 and the electric connection part 118, and has a slit-shaped path 131 connected to the slit-shaped path 115 of the heat conducting part 112. Next, an LED chip 102 is mounted on a recess 114 of the heat conducting part 112 and connected to the heat conducting part 112 and the electric connection part 118 by wires 104. At this time, a wire 104 is connected to an upper surface of the heat conducting part 112 inside the recess 114, and the other wire 104 is connected to the heat conducting part 112 through the paths 115 and 131.

Thereafter, transparent resin is filled in the recess 114 and the paths 115 and 131 and cured to form a first transparent encapsulant 140, thereby obtaining a lower structure 110-1. At this time, an ultra-violet ray absorbent for absorbing the ultra-violet rays generated from the LED chip 102 or phosphors for converting monochromatic light into white light may be mixed into the resin constituting the first transparent encapsulant 140.

Then, as shown in FIG. 10(b), transparent resin is filled in the recess 132 of the package body 130 and cured to form a second encapsulant 142.

The first and second transparent encapsulants 140 and 142 are made of resin having high transparency, which can transmit light generated from the LED chip 102 with minimum loss, and preferably, made of elastic resin. The elastic resin refers to silicone or gel-type resin, which exhibits minimal change by single wavelength light, such as yellowing, while having high refractivity, thus demonstrating excellent optical characteristics. In addition, unlike epoxy, it maintains gel or elastomer state after it is cured, thus it can protect the chip 102 more stably from thermal stress, vibrations, and external impacts.

Next, as shown in FIG. 10(c), an adhesive layer 150 is applied on an upper surface of the second transparent encapsulant 142 to attach a lower lens 160 thereon. Then, as shown in FIG. 10(d), an adhesive layer 170 is applied to bond the upper lens 180 on the lower lens 160, thereby completing the LED package 100-1.

As described hereinabove, the LED package 100-1 has substantially the identical structure with the LED package 100 explained with reference to FIGS. 4 to 7, except a lower structure 110-1.

As described above, the lower structure 110-1, the lower lens 160 and the upper lens 180 are individually formed and then combined together in their order to complete the LED package 100-1. This allows simplifying the shapes of the lower and upper lenses 160 and 180 and easy manufacturing process of the LED package 100-1.

In the meantime, before conducting the step of FIG. 10(c), electric/optical tests may be conducted on the structure of FIG. 10(b). This allows detecting defects in the middle process, thereby avoiding any unnecessary follow-up procedures.

Figure 12:
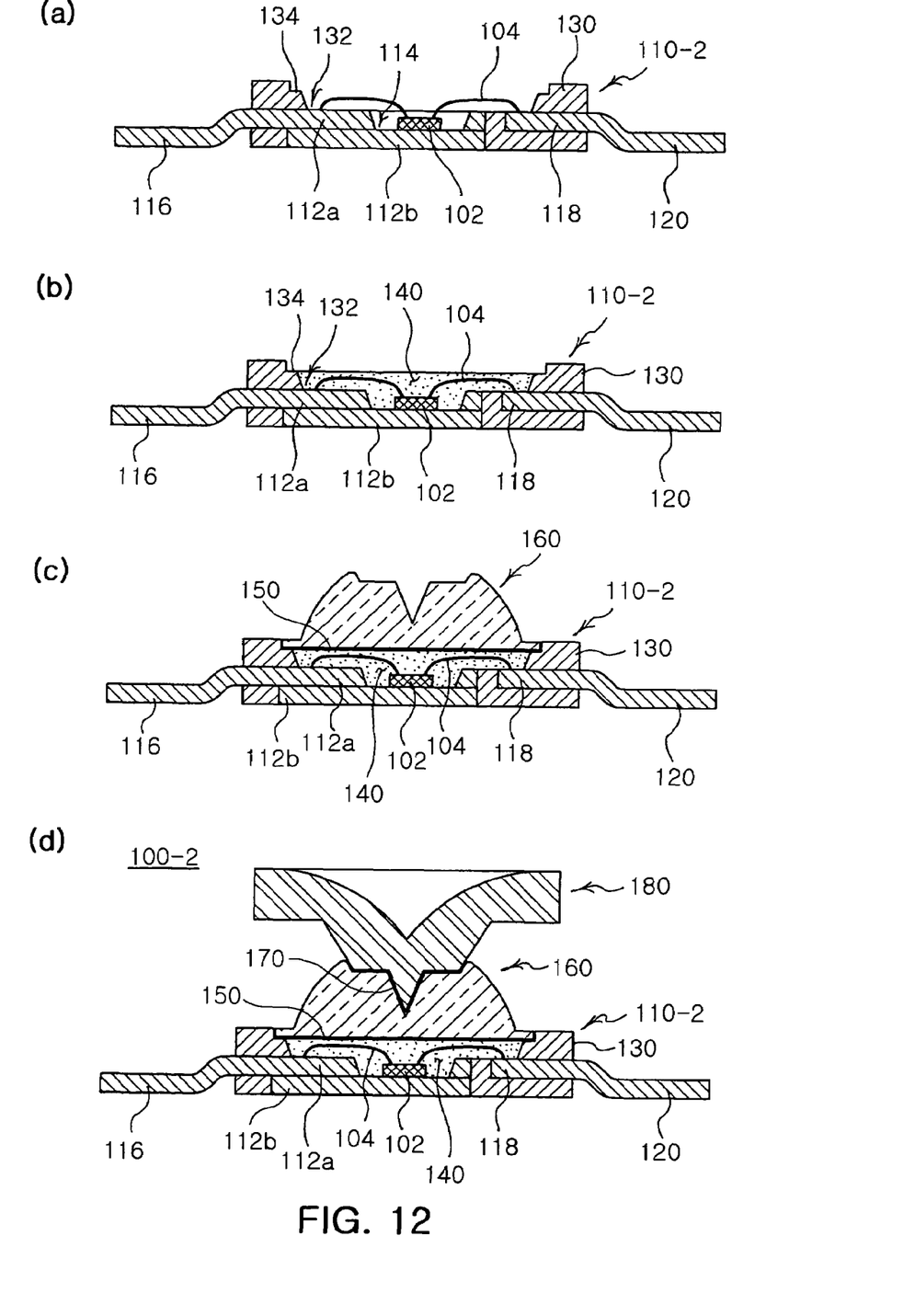
FIG. 12 is a sectional view illustrating a stepwise manufacturing method of an LED package according to yet another embodiment of the present invention.

Now, an LED package having a dual lens structure and a manufacturing method of the same according to yet another embodiment of the present invention will be explained with reference to FIG. 12.

The LED package 100-2 according to this embodiment has the substantially identical configuration with the LED package 100 described hereinabove except a lower structure 110-2. Therefore, the same reference numerals are given to corresponding components.

Specifically, the heat conducting part 112 of the LED package 100 is one member, but a heat conducting part corresponding to the LED package 100-2 according to this embodiment may be composed of an upper metal plate 112a and a lower metal plate 112b. The upper metal plate 112a has a recess 114 formed thereon for housing an LED chip 102 and is extended out of the package body 130 to form a lead 116. The lower metal plate 112b is integrally combined with the upper metal plate 112a to draw out the heat generated from the LED chip 102 and transferred via the upper metal plate 112a. The upper and lower metal plates 112a and 112b can be combined together by adhesion, welding (spot welding) to operate as one member.

The rest of the configuration of the LED package 100-2 except the above described points is identical with the LED package 100, and the corresponding manufacturing method of the LED package 100-2 is also identical with the method shown in FIG. 8.

In the meantime, the heat conducting part having a plurality of metal plates 112a and 112b as described above can be adopted in the lower structure 110-1 shown in FIGS. 10 and 11. For example, the path 113 of FIG. 11 can be formed on the portion of the metal plate 112a toward the electric connection part 118, and also the path 131 of FIG. 11 can be formed in the adjacent part of the package body 130, extending to the path 113.

The rest of the configuration of this embodiment is identical with the LED package 100 shown in FIGS. 4 to 7, and the rest of the manufacturing steps are identical with those in FIG. 9.

Figure 13:
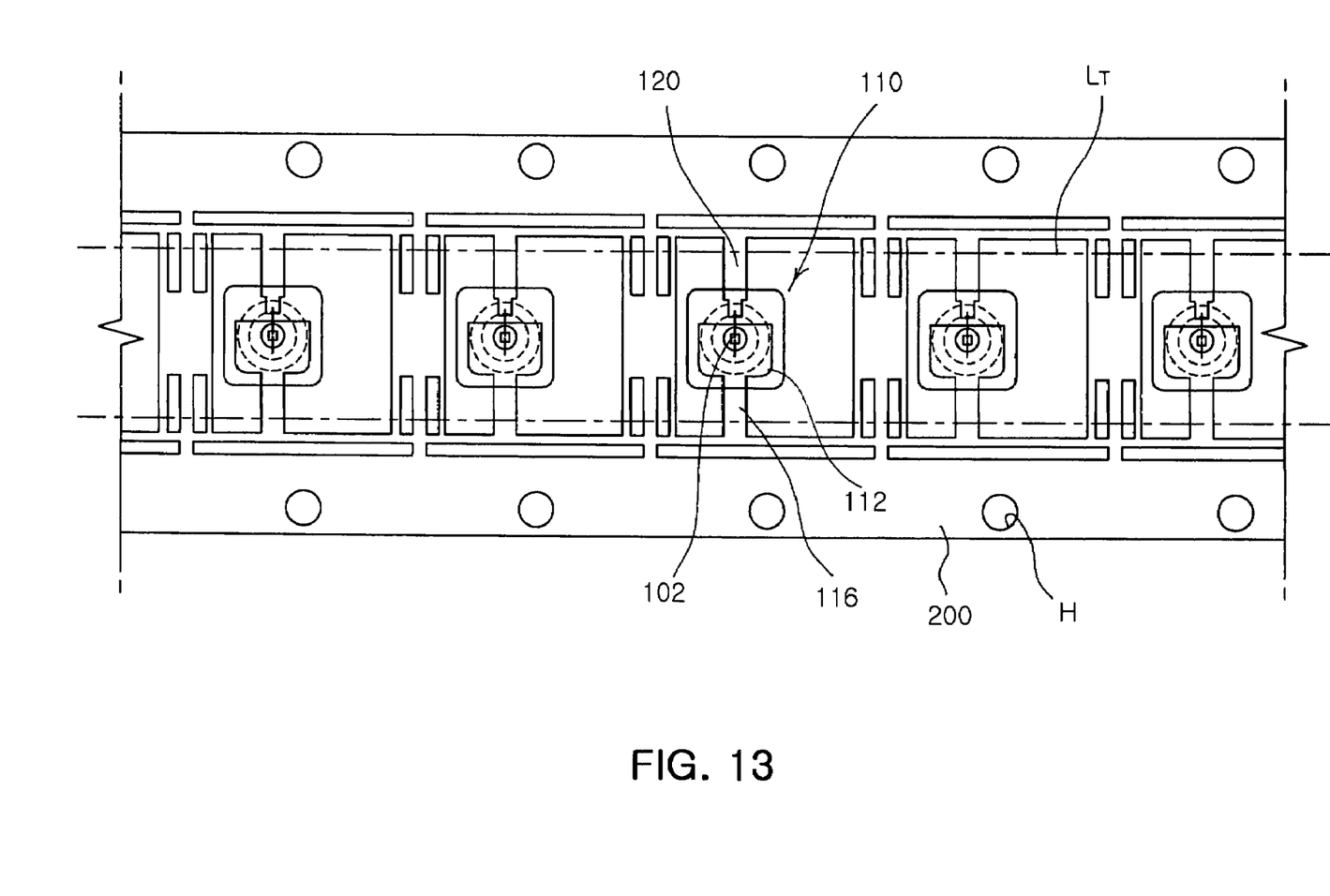
FIG. 13 is a sectional view illustrating a step of the manufacturing method of the LED package according to the present invention.

Now, mass-production of the LED package according to the present invention will be explained with reference to FIG. 13. A frame sheet 200 can be used to form a plurality of lower structures 110, thereby simultaneously manufacturing a plurality of LED packages.

The frame sheet 200 has a plurality of heat conducting parts 112 and leads 116 and 120 formed therein and holes H formed in the periphery for fixing and guiding. The lead 116 is connected integrally with the heat conducting part 112, and the other lead 120 is located in opposite side of the heat conducting part 112. Using molds (not shown), resin is injection-molded onto these heat conducting parts 112 and the leads 120 to obtain a plurality of lower structures 110.

At this time, the lower structure 110 can be any one of the structures described hereinabove, but is exemplified with the one shown in FIGS. 4 to 7 for the sake of convenience. That is, the configuration of FIG. 13 can be understood from that of FIG. 9(a).

Next, the step of FIG. 9(b) is conducted, and then, the leads 116 and 120 are cut out along the trimming line $L_T$ to obtain each unit structure. A plurality of combined structures of lower structures 110 and transparent encapsulants 140 can be obtained through a single procedure.

Then, the steps of FIGS. 9(c) and 9(d) are conducted to obtain the LED package 100.

Alternatively, after conducting the steps of FIGS. 9(b) through FIG. 9(d), the cutting procedure can be conducted to obtain a plurality of unit LED packages 100. This allows obtaining a plurality of LED packages 100 in a single procedure, increasing efficiency.

As set forth above, the LED package having a dual lens structure according to the present invention is easily manufactured by separately molding and then binding an upper lens and a lower lens configured to laterally emit light from an LED chip, and is efficiently installed.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode (LED) package having a dual lens structure comprising:
   an LED chip;
   a lower structure including a pair of electric connection parts for supplying power to the LED chip, a package body holding the electric connection parts, the package body having a recess for upwardly guiding light from the LED chip, and a transparent encapsulant filed in the recess of the package body to seal the LED chip;
   an upper-hemispheric lower lens fixed to an upper surface of the lower structure with a bottom part thereof attached to an upper surface of the transparent encapsulant; and
   a funnel-shaped upper lens fixed to an upper end of the lower lens, the upper lens including an axially symmetrical reflecting surface for laterally reflecting light from the lower lens and an emitting surface for laterally emitting light reflected from the reflecting surface,
   wherein the lower lens has a first groove formed on an upper end around an axis thereof, and the upper lens has a first projection which is formed on a lower end thereof and inserted into the first groove of the lower lens, thereby being combined with the lower lens,
   wherein the upper lens further includes a plurality of second projections formed around the projection, and the lower lens further includes a plurality of second grooves formed around the groove for receiving the second projections.

2. The LED package having a dual lens structure according to claim 1, wherein the lower lens comprises a planar undersurface for surface-to-surface contact with the upper surface of the lower structure.

3. The LED package having a dual lens structure according to claim 1, further comprising a transparent adhesive layer between the lower structure and the lower lens.

4. The LED package having a dual lens structure according to claim 1, further comprising an adhesive layer between the first groove of the lower lens and the first projection of the upper lens.

5. The LED package having a dual lens structure according to claim 1, wherein the lower lens has a plurality of projections on a periphery of an undersurface thereof, and the lower structure has a plurality of grooves formed around the recess for receiving the projections.

6. The LED package having a dual lens structure according to claim 1, wherein each of the lower lens and the upper lens is made of one selected from a group consisting of epoxy molding compound, silicone, and epoxy resin.

7. The LED package having a dual lens structure according to claim 1, further comprising a heat conducting part for supporting the LED chip within the package body, the heat conducting part having a recess formed on a position directly below the recess of the package body for upwardly reflecting light generated from the LED chip.

8. The LED package having a dual lens structure according to claim 7, wherein the heat conducting part is integral with one of the electric connection parts.

9. The LED package having a dual lens structure according to claim 7, wherein the heat conducting part comprises a plurality of metal plates and the recess of the heat conducting part is a hole formed in an uppermost one of the metal plates.

10. The LED package having a dual structure according to claim 7, wherein a portion of the heat conducting part and a portion of the package body around the LED chip are cut out to form a slit-shaped path extending to the electric connection part, and
    the LED chip is connected to the electric connection part by a wire through the slit-shaped path.

11. A light emitting diode (LED) package having a dual lens structure comprising:
    an LED chip;
    a lower structure including a pair of electric connection parts for supplying power to the LED chip, a package body holding the electric connection parts, the package body having a recess for upwardly guiding light from the LED chip, and a transparent encapsulant filled in the recess of the package body to seal the LED chip;
    an upper-hemispheric lower lens fixed to a upper surface of the lower structure with a bottom part thereof attached to an upper surface of the transparent encapsulant; and
    a funnel-shaped upper lens fixed to an upper end of the lower lens, the upper lens including an axially symmetrical reflecting surface for laterally reflecting light from the lower lens and an emitting surface for laterally emitting light reflected from the reflecting surface,
    wherein the lower lens has a plurality of projections on a periphery of an undersurface thereof, and the lower structure has a plurality of grooves formed around the recess for receiving the projections.

12. A light emitting diode (LED) package having a duel lens structure comprising:
    an LED chip;
    a lower structure including a pair of electric connection parts for supplying power to the LED chip, a package body holding the electric connection parts, the package body having a recess for upwardly guiding light from the LED chip, and a transparent encapsulant filled in the recess of the package body to seal the LED chip;
    an upper-hemispheric lower lens fixed to an upper surface of the lower structure with a bottom part thereof attached to an upper surface of the transparent encapsulant;
    a funnel-shaped upper lens fixed to an upper end of the lower lens, the upper lens including an axially symmetrical reflecting surface for laterally reflecting light from the lower lens and an emitting surface for laterally emitting light reflected from the reflecting surface; and,
    a heat conducting part for supporting the LED chip within the package body, the heat conducting part having a recess formed on a position directly below the recess of the package body for upwardly reflecting light generated from the LED chip,
    wherein a portion of the heat conducting part and a portion of the package body around the LED chip are cut out to form a slit-shaped path extending to the electric connection part, and
    the LED chip is connected to the electric connection part by a wire through the slit-shaped path.

* * * * *